United States Patent [19]
Li et al.

[11] Patent Number: 5,838,072
[45] Date of Patent: Nov. 17, 1998

[54] INTRACHIP POWER DISTRIBUTION PACKAGE AND METHOD FOR SEMICONDUCTORS HAVING A SUPPLY NODE ELECTRICALLY INTERCONNECTED WITH ONE OR MORE INTERMEDIATE NODES

[75] Inventors: Li-Chun Li, Los Gatos; Lawrence C. Liu, Menlo Park, both of Calif.; Michael A. Murray, Bellevue, Wash.

[73] Assignee: Mosel Vitalic Corporation, San Jose, Calif.

[21] Appl. No.: 805,391

[22] Filed: Feb. 24, 1997

[51] Int. Cl.[6] .............................. H01L 23/28; H01L 23/48
[52] U.S. Cl. .................. 257/786; 257/776; 257/691; 257/779; 257/668
[58] Field of Search .............................. 257/786, 666, 257/676, 787, 668, 691, 692, 675, 723, 724, 728, 779, 776; 361/813; 174/52.4

[56] References Cited

U.S. PATENT DOCUMENTS

| | | | |
|---|---|---|---|
| 5,170,312 | 12/1992 | Davies et al. | 361/100 |
| 5,172,471 | 12/1992 | Huang | 29/840 |
| 5,276,352 | 1/1994 | Komenaka et al. | 257/666 |
| 5,304,737 | 4/1994 | Kim | 257/787 |
| 5,473,196 | 12/1995 | De Givry | 257/776 |
| 5,587,607 | 12/1996 | Yasuda et al. | 257/690 |
| 5,686,764 | 11/1997 | Fulcher | 257/778 |
| 5,723,906 | 3/1998 | Rush | 257/776 |

*Primary Examiner*—Tom Thomas
*Assistant Examiner*—Alexander Oscar Williams
*Attorney, Agent, or Firm*—Skjerven, Morrill, Macpherson, Franklin & Friel LLP; Alan H. MacPherson; Adrian J. Lee

[57] ABSTRACT

An integrated circuit has a supply node for supplying power to at least one intermediate node coupled to circuitry for receiving power. Rather than transmit power from the supply node to the intermediate node by means of a power bus formed as part of the chip interconnect structure, power is supplied to an external wire which is coupled from the supply to the intermediate node. Other than as connected to the supply node and intermediate node, the wire is electrically isolated from the die.

This structure and method for making the semiconductor package allow power to be distributed within a semiconductor chip without sacrificing valuable chip space and without requiring a special lead frame for distributing the power within the semiconductor chip.

8 Claims, 2 Drawing Sheets

INTRACHIP POWER DISTRIBUTION PACKAGE AND METHOD FOR SEMICONDUCTORS HAVING A SUPPLY NODE ELECTRICALLY INTERCONNECTED WITH ONE OR MORE INTERMEDIATE NODES

FIELD OF THE INVENTION

This invention relates to power distribution in semiconductor chips and in particular to a structure and method for transmitting power from a node of a semiconductor chip to another node within the semiconductor chip using minimal chip space and without using a special lead frame.

BACKGROUND

All semiconductor chips require power in order to operate. In some semiconductor chip designs, power is required at different nodes on the semiconductor chip.

One way to provide power to a node is to draw power from another node of the semiconductor chip.

Hereafter, this will be referred to as "intrachip power distribution".

FIG. 1 illustrates a prior art package that accomplishes intrachip power distribution using substrate transmission. In substrate transmission, a conducting channel 14 is formed in a substrate 11 of a semiconductor chip 10. Conducting channel 14 electrically couples a supply node 12 to an intermediate node 13, thereby providing a power connection. Arrows adjacent to the conducting channel show the path and direction of power transmission.

Reducing power consumption of a semiconductor chip is important. A more efficient semiconductor chip is achieved by eliminating parasitic resistance. This reduces parasitic power consumption and increases performance thereby reducing running costs and increasing possible applications. For example, reduced power consumption is important in portable computers in which lighter batteries and a longer battery life are needed.

Furthermore, reducing power consumption usually reduces heat generation within the semiconductor chip. heat dissipation is a design issue because excessive heat can significantly deteriorate the functionality of the semiconductor chip.

Electrical power loss and heat generation are inversely related to the cross sectional area of the conductor. This motivates the designer to make the conducting channel 14 wide. However, there is also a competing motivation to make the conducting channel 14 narrow in order to conserve valuable chip space.

These competing motivations result in a conducting channel which has more power loss and heat generation during transmission than would occur if chip space was not a concern. Semiconductor chips become increasingly integrated as time goes by and thus chip space has become even more valuable. Therefore, an intrachip power distribution package and method without using chip space are desired.

Fig. 2 illustrates a prior art package using a special lead frame for accomplishing intrachip power distribution without sacrificing chip space. A conducting channel 24 is specially manufactured as part of a lead frame 21 of a semiconductor chip package 20. The conducting channel 24 of the lead frame 21 is electrically coupled to a supply node 22 and to an intermediate node 23 with bonding wires 25 and 26, thereby providing a power connection. Arrows on conducting channel 24 show the path and direction of power transmission.

This semiconductor chip package 20 eliminates the need for valuable chip space in intrachip power distribution. However, the semiconductor chip package 20 requires a special lead frame because standard lead frames typically do not have a suitable conducting channel 24. Lead frame 21 is only one of many special lead frame designs that can accomplish intrachip power distribution without using chip space. However, these special lead frames are most often more expensive than standard lead frames because these special lead frames typically must be custom made. Therefore, an intrachip power distribution package and method that use minimal chip space and do not require a customized lead frame are desired.

SUMMARY OF THE INVENTION

In accordance with this invention, a structure and method are provided to distribute power within a chip. The structure provides a semiconductor package comprising a semiconductor die, a supply node formed on the die and electrically coupled to a power source, at least one intermediate node formed on the die and electrically coupled to circuitry in the die, and one or more conductors lying external to and within the periphery of the semiconductor die, coupling the supply node to the intermediate nodes. Power from the supply node is thus available at the circuitry coupled to the intermediate nodes.

Furthermore, a method of transmitting power from a supply node within a semiconductor die to an intermediate node within the semiconductor die includes supplying power to the supply node and then transmitting power to the intermediate node through a conductor coupled to the supply node at one end and to the intermediate node at the other. The conductor lies external to but within the periphery of the semiconductor die. Power is received in the intermediate node.

Advantages of this invention include a reduction in space taken on chip by power buses, a reduction in the voltage drop across the chip as a result of the distribution of power across the chip because conductors of larger cross-sectional area can be used and a reduction in electro migration.

This invention will be more fully understood in connection with the following detailed description taken together with the drawings.

DETAILED DESCRIPTION OF THE PREFERRED EMBODIMENTS

While embodiments of this invention will be described below, those skilled in the art will recognize that other structures and methods are capable of implementing the principles of this invention. Thus the following description is illustrative only and not limiting.

Figure 3:
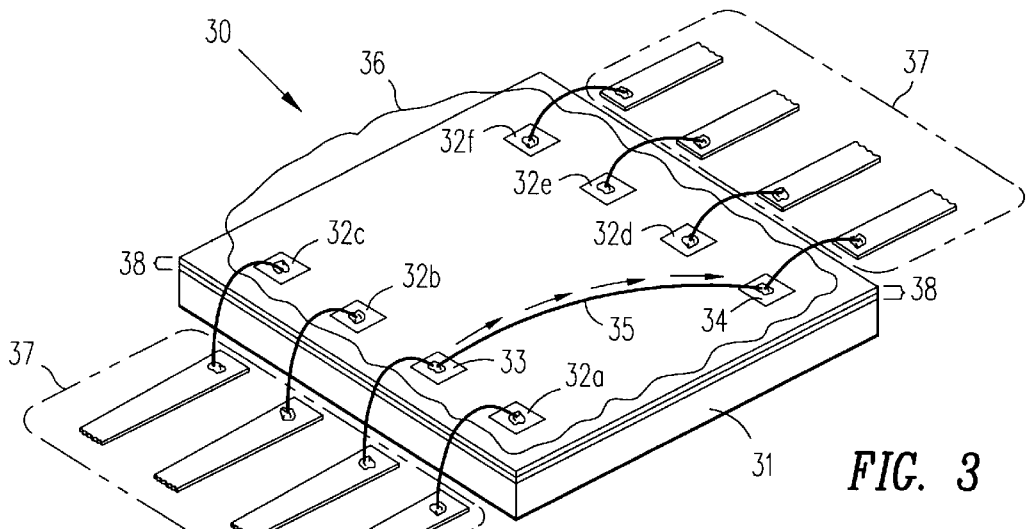
FIG. 3 illustrates an integrated circuit power distribution structure and method according to one embodiment of the invention.

FIG. 3 illustrates an integrated circuit power distribution structure and method according to one embodiment of the invention. Semiconductor die 30 comprises a semiconductor substrate 31, signal nodes 32a though 32f, a supply node 33, an intermediate node 34 and a plurality of conductive and insulating layers shown generally as layers 38. A conductive body, such as a conductive lead 35 and a protective layer 36, (shown as transparent in FIG. 3 to allow the underlying components to be seen but in reality opaque), which covers the surface of the substrate 31 as well as conductive lead 35, are formed on top of the semiconductor die 30. A lead frame, of which portions 37 are shown, is electrically connected to the semiconductor die.

Nodes 32a through 32f, supply node 33, and intermediate node 34 are disposed in or on substrate 31. In one embodiment, supply node 33, intermediate node 34, or both are coupled to electrical circuitry (not shown) within the substrate 31 of semiconductor die 30. Nodes 32a through 32f are coupled to lead frame portions 37 by wires formed using well-known wire bonding techniques, thereby providing a connection with other circuitry, typically on a printed circuit board (not shown).

In FIG. 3, conductive lead 35 is shown electrically coupled to supply node 33 and intermediate node 34 thereby allowing power to flow from supply node 33, through conductive lead 35, to intermediate node 34, thereby establishing an intrachip power route external to but across the die.

Figure 4:
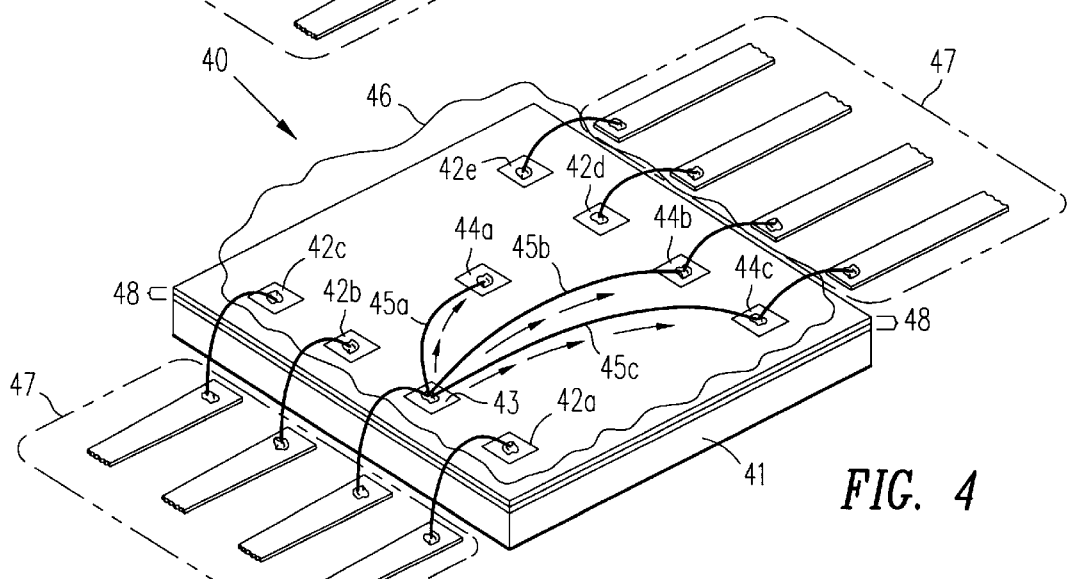
FIG. 4 illustrates an integrated circuit power distribution structure and method according to a second embodiment of the invention in which a supply node distributes power to a plurality of intermediate nodes in parallel.

FIG. 4 illustrates a semiconductor chip power distribution package according to a second embodiment of the invention in which power is distributed from a supply node to a plurality of intermediate nodes in parallel. Integrated circuit 40 comprises a substrate 41, signal nodes 42a though 42e, supply node 43, a plurality of intermediate nodes 44a through 44c, a plurality of conductive and insulating layers shown generally as layers 48, a plurality of conductive bodies, such as a conductive leads 45a through 45c, protective layer 46, and a lead frame of which portions 47 are shown. Protective layer 46 is generally opaque but is shown as transparent to allow the normally invisible components of the semiconductor die to be seen.

Nodes 42a through 42e and intermediate nodes 44a through 44c are disposed in or on substrate 41. In one embodiment, one or more of supply node 43 and intermediate nodes 44 are coupled to electrical circuitry (not shown) within substrate 41. Nodes 42a through 42e are coupled to lead frame portions 47 by wires formed using well-known wire bonding techniques, thereby providing a connection with other circuitry, typically on a printed circuit board (not shown).

In FIG. 4, supply node 43 is shown electrically coupled to intermediate nodes 44a, 44b and 44c via conductive leads 45a, 45b, and 45c, respectively. Therefore, power from supply node 43 flows through conductive lead 45a to intermediate node 44a, through conductive lead 45b to intermediate node 44b, and through conductive lead 45c to intermediate node 44c, thereby establishing a parallel intrachip power distribution external to but across the die.

Figure 5:
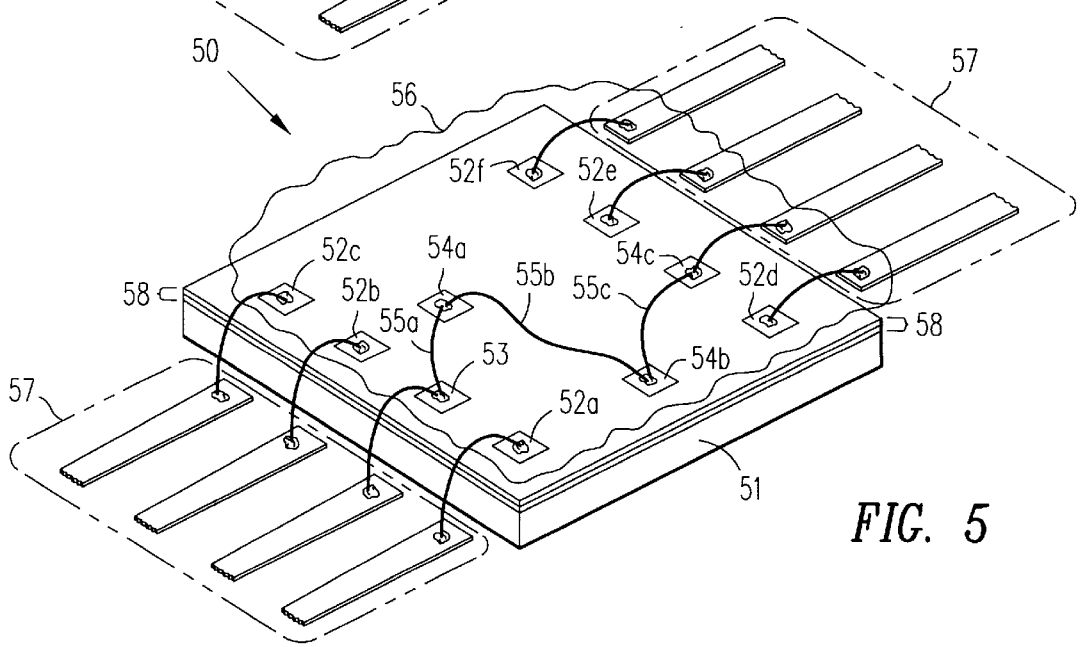
FIG. 5 illustrates an integrated circuit power distribution structure and method according to a third embodiment of the invention in which a supply node distributes power to a plurality of intermediate nodes in series.

FIG. 5 illustrates a semiconductor chip power distribution package according to a third embodiment of the invention in which a supply node distributes power to a plurality of intermediate nodes in series. Integrated circuit 50 comprises a semiconductor die including substrate 51, signal nodes 52a though 52f, a supply node 53, a plurality of intermediate nodes 54a through 54c and a plurality of conductive and insulating layers shown generally as layers 58. A plurality of conductive bodies, such as conductive leads 55a through 55c and a protective layer 56 are formed on top of the semiconductor die. A lead frame, of which portions 57 are shown, is electrically connected to bonding pads 52a–52f, 53 and 54c. Protective layer 56 is generally shown as opaque but is shown as transparent to allow the normally invisible components of the semiconductor die to be seen.

Nodes 52a through 52f, supply node 53, and intermediate nodes 54a through 54c are disposed in or on the semiconductor die. In one embodiment, supply node 53, intermediate node 54, or both are coupled to electrical circuitry (not shown) within substrate 51. Nodes 52a through 52f are coupled to lead frame 57 by wires formed using well-known wire bonding techniques, thereby providing a connection with other circuitry, typically on a printed circuit board (not shown).

In FIG. 5, supply node 53 is shown electrically coupled, via conductive lead 55a, to intermediate node 54a; intermediate node 54a is shown electrically coupled, via conductive lead 55b, to intermediate node 54b; and intermediate node 54b is shown electrically coupled, via conductive lead 55c, to intermediate node 54c. Therefore, power from supply node 53 flows in series through conductive lead 55a to intermediate node 54a and then through conductive lead 55b to intermediate node 54b and then through conductive lead 55c to intermediate node 54c, thereby establishing a series intrachip power distribution external to but across the die.

In one embodiment, a combination of the parallel 35 (FIG. 4) and series (FIG. 5) power distributions is implemented. In the preferred embodiment, conductive leads 35, 45, and 55 are wires and are electrically coupled to supply nodes 33, 43, and 53, respectively, and intermediate nodes 34, 44, and 54, respectively, using well-known wire bonding techniques. However, it will be apparent to one skilled in the art that other coupling methods, such as pressure connections (where contacts are not bonded but are maintained only by an external, continuously applied force) may be successfully used in the present invention. In several embodiments, the conductive leads 35, 45, and 55 are substantially straight and supply nodes 33, 43, and 53 are bond pads. Conductive leads 35, 45, and 55 are secured and encapsulated in place during the final stages of packaging in which protective layers 36, 46, and 56, respectively, cover the top surfaces of substrates 31, 41, and 51, respectively. Protective layer 36, 46 and 56 substantially encase the conductive leads. Methods and materials for providing protective layers 36, 46, and 56 are well known in the art.

In the present invention, there is no need for a conducting channel to be provided in lead frames 37, 47, and 57 between supply nodes 33, 43, and 53, respectively, and intermediate nodes 34, 44, and 54, respectively. In the preferred embodiment, lead frames 37, 47, and 57 are standard lead frames. This reduces the cost of materials required to perform intrachip power distribution without using chip space.

The preferred embodiment has been described with reference to a fixed number of nodes 32a through 32f, 42a through 42e, and 52a through 52f. The numbers and configurations of these nodes are not critical. The preferred embodiment may contain greater or fewer nodes and a different configuration than described with reference to FIGS. 3 through 5. Furthermore, the positions of supply nodes 33, 43, and 53 and intermediate nodes 34, 44, and 54 are not critical to the present invention.

While the present invention has been shown with supply nodes 33, 43, and 53 and some of the intermediate nodes 34, 44, and 54 coupled to the lead frames, these supply nodes and intermediate nodes need not be so coupled. Each intermediate node may act as a supply node for other intermediate nodes after power has been supplied to it from supply node 33, 43, or 53. Furthermore, each of supply nodes 33, 43, or 53 and powered intermediate nodes may directly supply power to more than one intermediate node.

Figure 1:
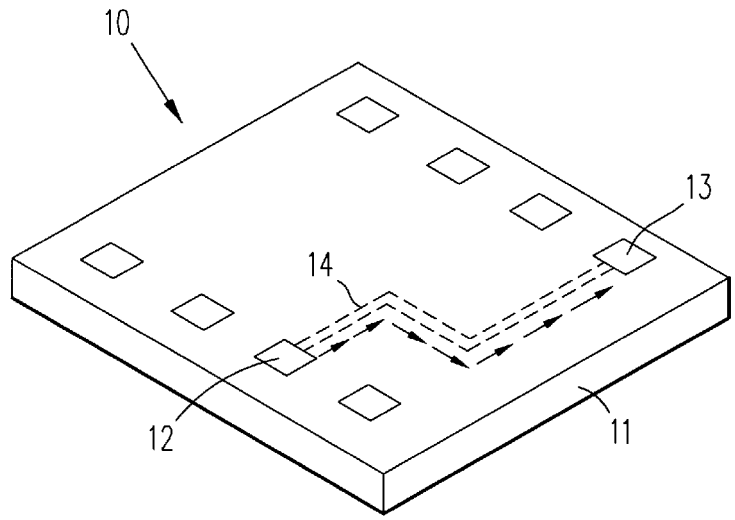
FIG. 1 illustrates a prior art package for accomplishing intrachip power distribution using substrate transmission.
Figure 2:
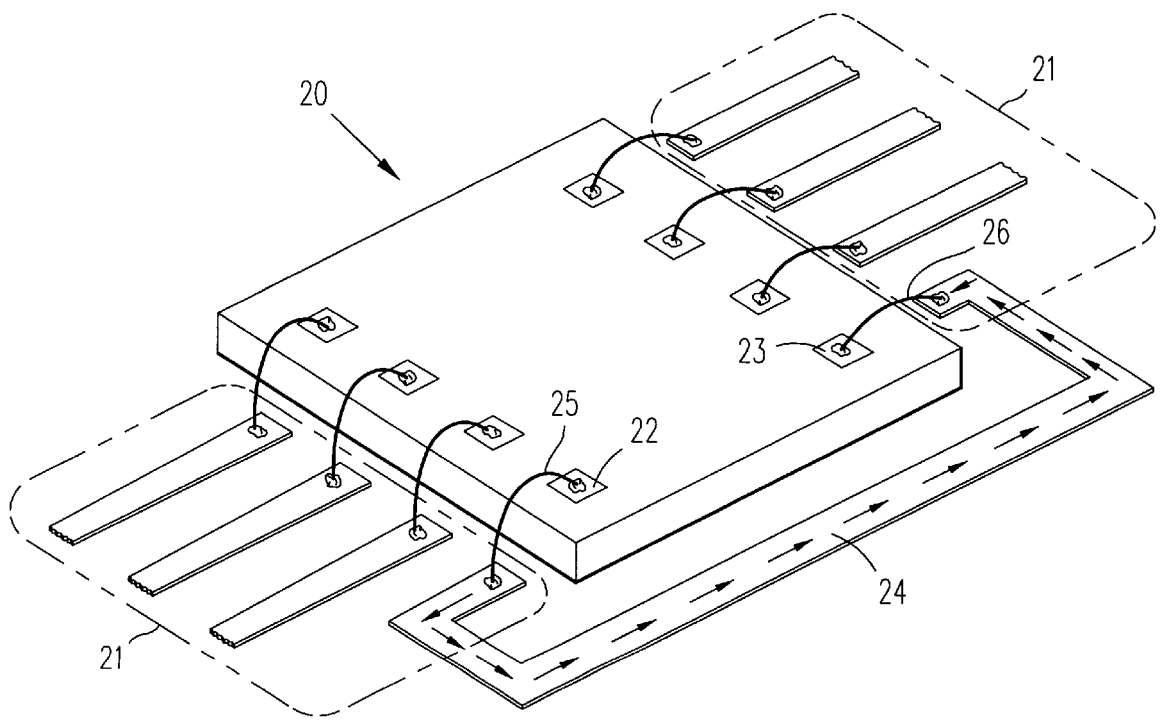
FIG. 2 illustrates a prior art package using a special lead frame for accomplishing intrachip power distribution without sacrificing chip space.

In the present invention, the thickness of the conductive bodies 35, 45, and 55 is not as much a concern as it is in the prior art substrate transmission package (FIG. 1) because intrachip power distribution is accomplished without using chip space. Therefore, these conductive bodies may be made much larger than conducting channel 14 (FIG. 1) of the prior art substrate transmission package, thereby reducing power loss and heat generation. Therefore, this invention provides a structure and method for intrachip power distribution which require less chip space, reduce power loss and heat generation, and do not require a special lead frame.

Applicants' invention is not limited in scope to the described embodiment. Accordingly, other embodiments and variations not described herein may be considered within the scope of our invention as defined by one or more of the following claims.

What is claimed is:

1. An integrated circuit comprising:

a semiconductor die;

a supply node electrically connected to a power source, wherein said supply node comprises a bond pad;

first, second, and third intermediate nodes;

a first conductive lead lying external to and within the periphery of said semiconductor die, said first conductive lead having first and second ends, wherein said first end of said first conductive lead is electrically connected to said supply node and said second end of said first conductive lead is electrically connected to said first intermediate node;

a second conductive lead lying external to and within the periphery of said semiconductor die, said second conductive lead having first and second ends, wherein said first end of said second conductive lead is electrically connected to said supply node and said second end of said second conductive lead is electrically connected to said second intermediate node. wherein power from said power source is available at said first and second intermediate nodes; and a third conductive lead lying external to and within said periphery of said semiconductor die, said third conductive lead comprising a first end and a second end, wherein said first end of said third conductive lead is electrically connected to said second intermediate node and said second end of said third conductive lead is electrically connected to said third intermediate node, wherein power from said power source is available at said third intermediate node through said second intermediate node.

2. The integrated circuit as in claim 1 wherein said first conductive lead comprises a wire and said first end of said first conductive lead is wire bonded to said supply node and wherein said second end of said first conductive lead is wire bonded to said first intermediate node.

3. The integrated circuit as in claim 1 wherein said supply node and said first intermediate node are bond pads.

4. The integrated circuit as in claim 2 wherein said supply node and said first intermediate node are bond pads.

5. The integrated circuit as in claim 2 wherein said wire is encapsulated by protective material.

6. The integrated circuit of claim 1 wherein said first conductive lead has a path that is substantially straight between said supply node and said first intermediate node.

7. The integrated circuit of claim 1 wherein said first conductive lead is substantially encapsulated by a packaging layer.

8. The integrated circuit of claim 1 wherein said first intermediate node is electrically coupled to circuitry within said semiconductor die.

* * * * *

UNITED STATES PATENT AND TRADEMARK OFFICE
CERTIFICATE OF CORRECTION

PATENT NO.   : 5,838,072
ISSUE DATE   : 11/17/98
INVENTOR(S)  : Li, Li-Chun; Liu, Lawrence C.; Murray, Michael A.

It is certified that error appears in the above-identified patent and that said Letters Patent is hereby corrected as shown below:

Column 4, line 31: Delete "35".

Signed and Sealed this

Twenty-sixth Day of September, 2000

Attest:

Q. TODD DICKINSON

*Attesting Officer*   *Director of Patents and Trademarks*